(12) United States Patent
Bash et al.

(10) Patent No.: US 8,904,383 B2
(45) Date of Patent: Dec. 2, 2014

(54) VIRTUAL MACHINE MIGRATION ACCORDING TO ENVIRONMENTAL DATA

(75) Inventors: Cullen E. Bash, Los Gatos, CA (US);
Bret A. McKee, Fort Collins, CO (US);
Chris D. Hyser, Victor, NY (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 605 days.

(21) Appl. No.: 12/936,900

(22) PCT Filed: Apr. 10, 2008

(86) PCT No.: PCT/US2008/059812
§ 371 (c)(1),
(2), (4) Date: Dec. 13, 2010

(87) PCT Pub. No.: WO2009/126154
PCT Pub. Date: Oct. 15, 2009

(65) Prior Publication Data
US 2011/0107332 A1    May 5, 2011

(51) Int. Cl.
G06F 9/455 (2006.01)
G06F 1/00 (2006.01)
G06F 9/48 (2006.01)
H04L 29/08 (2006.01)
G06F 9/50 (2006.01)
G06F 1/20 (2006.01)
H05K 7/20 (2006.01)

(52) U.S. Cl.
CPC .............. *H04L 67/34* (2013.01); *G06F 9/4856* (2013.01); *G06F 9/5094* (2013.01); *G06F 1/206* (2013.01); *H05K 7/20836* (2013.01)

USPC .............................................. 718/1; 713/300

(58) Field of Classification Search
None
See application file for complete search history.

(56) References Cited

U.S. PATENT DOCUMENTS

| 5,745,735 | A  | 4/1998  | Cohn    |
| 6,574,104 | B2 | 6/2003  | Patel   |
| 6,795,928 | B2 | 9/2004  | Bradley |
| 6,859,882 | B2 | 2/2005  | Fung    |
| 6,889,908 | B2 | 5/2005  | Crippen |
| 6,901,522 | B2 | 5/2005  | Buch    |
| 7,051,946 | B2 | 5/2006  | Bash    |
| 7,058,826 | B2 | 6/2006  | Fung    |
| 7,127,625 | B2 | 10/2006 | Farkas  |
| 7,197,433 | B2 | 3/2007  | Patel   |

(Continued)

FOREIGN PATENT DOCUMENTS

| CN | 1947096 A | 4/2007 |
| EP | 1745374   | 5/2004 |

(Continued)

OTHER PUBLICATIONS

Clark et al., "Live Migration of Virual Machines" In the Proc. of the 2nd Symposium on Networked Systems Diesign and Implementation (NSDI'05) Boston, MA.

(Continued)

*Primary Examiner* — Kenneth Tang

(57) ABSTRACT

Embodiments are directed to virtual machine migration according to environmental data in a data center. One embodiment is a method that analyzes environmental data for a data center having plural servers and migrates virtual machines among the servers to increase cooling efficiency in the data center.

16 Claims, 5 Drawing Sheets

(56) References Cited

U.S. PATENT DOCUMENTS

| | | | |
|---|---|---|---|
| 7,203,944 | B1 | 4/2007 | van Rietschote |
| 7,447,920 | B2 | 11/2008 | Sharma |
| 7,519,964 | B1 | 4/2009 | Islam |
| 7,596,431 | B1 | 9/2009 | Forman |
| 8,156,490 | B2 | 4/2012 | Bozek et al. |
| 8,566,825 | B2 | 10/2013 | Bozek et al. |
| 8,677,365 | B2 | 3/2014 | Bash |
| 2001/0034752 | A1 | 10/2001 | Kremien |
| 2003/0193777 | A1 | 10/2003 | Friedrich |
| 2004/0117539 | A1 | 6/2004 | Bennett |
| 2004/0186920 | A1 | 9/2004 | Birdwell |
| 2005/0023363 | A1 | 2/2005 | Sharma |
| 2005/0060590 | A1 | 3/2005 | Bradley |
| 2005/0166074 | A1 | 7/2005 | Hack |
| 2005/0166075 | A1 | 7/2005 | Hack |
| 2005/0228618 | A1 | 10/2005 | Patel |
| 2005/0251802 | A1 | 11/2005 | Bozek et al. |
| 2006/0101189 | A1* | 5/2006 | Chandrasekaran et al. ...... 711/6 |
| 2006/0230407 | A1 | 10/2006 | Rosu |
| 2006/0259622 | A1 | 11/2006 | Moore |
| 2006/0259793 | A1* | 11/2006 | Moore et al. .................. 713/300 |
| 2008/0004837 | A1 | 1/2008 | Zwinger |
| 2010/0217454 | A1* | 8/2010 | Spiers et al. .................. 700/300 |
| 2011/0161968 | A1 | 6/2011 | Bash |
| 2012/0137293 | A1 | 5/2012 | Bozek et al. |

FOREIGN PATENT DOCUMENTS

| | | |
|---|---|---|
| JP | 5089380 | 12/2007 |
| JP | 2007536657 | 12/2007 |
| KR | 100961806 | 1/2007 |
| KR | 20070008668 | 1/2007 |
| WO | WO-2005109195 | 5/2004 |

OTHER PUBLICATIONS

International Search Report, PCT/US2008/059812, Jan. 9, 2009, 11 pages.

Justin Moore, "Automated Cost-Aware Data Center Management", Ph.D. Dissertation, Department of Computer Science, Duke University, Jun. 2006.

Sapuntzakis et al., "Optimizing the management of virtual computers" In Proceedings of the 5th Symposium on Operating Systems Design and Implementation (OSDI), pp. 377-390 Dec. 2002.

Hou et al., "A Genetic Algorithm for Multiprocessor Scheduling," IEEE Transactions on Parallel and Distributed Systems, vol. 5, No. 2, Feb. 1994 (8 pages).

Megow et al., "Stochastic Online Scheduling on Parallel Machine," Springer-Verlag Berlin Heidelberg, pp. 167-180, 2005.

YarKhan et al., "Experiments with Scheduling Using Simulated Annealing in a Grid Environment," Springer-Verlag Berlin Heidelberg, pp. 232-242, 2002.

Bianchini et al., Power and Energy Management for Server Systems, Nov. 2004, IEEE, pp. 68-76.

Sharma et al., Balance of Power: Dynamic Thermal Management for Internet Data Centers, Feb. 18, 2003, pp. 1-13.

Chris D. Hyser et al., U.S. Appl. No. 11/588,607 entitled Migrating Virtual Machines Between Physical Machines in a Defined Group filed Oct. 27, 2006 (30 pages).

Chris D. Hyser et al., U.S. Appl. No. 11/588,691 entitled Selecting One of Plural Layouts of Virtual Machines on Physical Machines, filed Oct. 27, 2006 (32 pages).

* cited by examiner

VIRTUAL MACHINE MIGRATION ACCORDING TO ENVIRONMENTAL DATA

CROSS-REFERENCE TO RELATED APPLICATIONS

This application relates to and incorporates herein by reference co-pending U.S. patent applications having Ser. No. 10/929,448 filed Aug. 31, 2004, Ser. No. 11/590,525 filed Oct. 31, 2006, and Ser. No. 11/588,691 filed Oct. 27, 2006. Also, this application is a national stage application under 35 U.S.C. §371 of PCT/US2008/059812, filed 10 Apr. 2008.

BACKGROUND

Data centers are becoming increasingly more densely packed with electronic components to accommodate for ever-increasing computing demands. Examples of such data centers are Internet data centers having server applications that execute in a horizontally scalable topology across hundreds or thousands of commodity servers.

The increased scale and power densities associated with the more densely packed data centers typically have a significant impact on the thermal properties of the data centers. Specifically, the electronic components and racks generate tremendous amounts of heat that is costly to remove. By way of example, the power required to remove the heat dissipated by a plurality of racks in a data center is generally equal to the power needed to operate the components in the racks.

Data centers can cost millions of dollars per year to power and cool. A large factor in this cost is the cooling of physical servers that are located in non-ideal locations within the data center. Significant money can be saved if efficient techniques are used to cool servers in data centers.

DETAILED DESCRIPTION

Embodiments are directed to systems, methods, and apparatus for deploying and migrating virtual machines within a data center. Migration is based on environmental conditions that exist in the data center. Exemplary embodiments combine virtualization techniques and environmental data to determine efficient locations for migrating workloads among servers in the data center.

Exemplary embodiments utilize virtualization techniques to deploy and migrate computational workloads among physical machines within data centers. Movement and placement of virtual machines is automated and based on environmental conditions that are detected and/or exhibited in the data center. By way of example, such environmental conditions include, but are not limited to, dynamic information such as cooling, airflow, temperature, humidity, etc.

As one example, exemplary embodiments recognize that a variety of factors cause temperature variations and thermal hot spots in the data center. For instance, non-uniform equipment loads in the data center cause some areas to have higher temperatures as compared with other areas, while irregular airflows cause some areas to have lower temperatures than other areas. Virtual machine workloads are moved or distributed throughout the data center in accordance with such temperature variations to reduce cooling costs and increase cooling efficiency. For example, virtual machines are moved from a first area of the data center having a relatively higher temperature to a second area having a relatively lower temperature. This movement reduces thermal imbalances that can interfere with efficient cooling operations in the data center.

Figure 3:
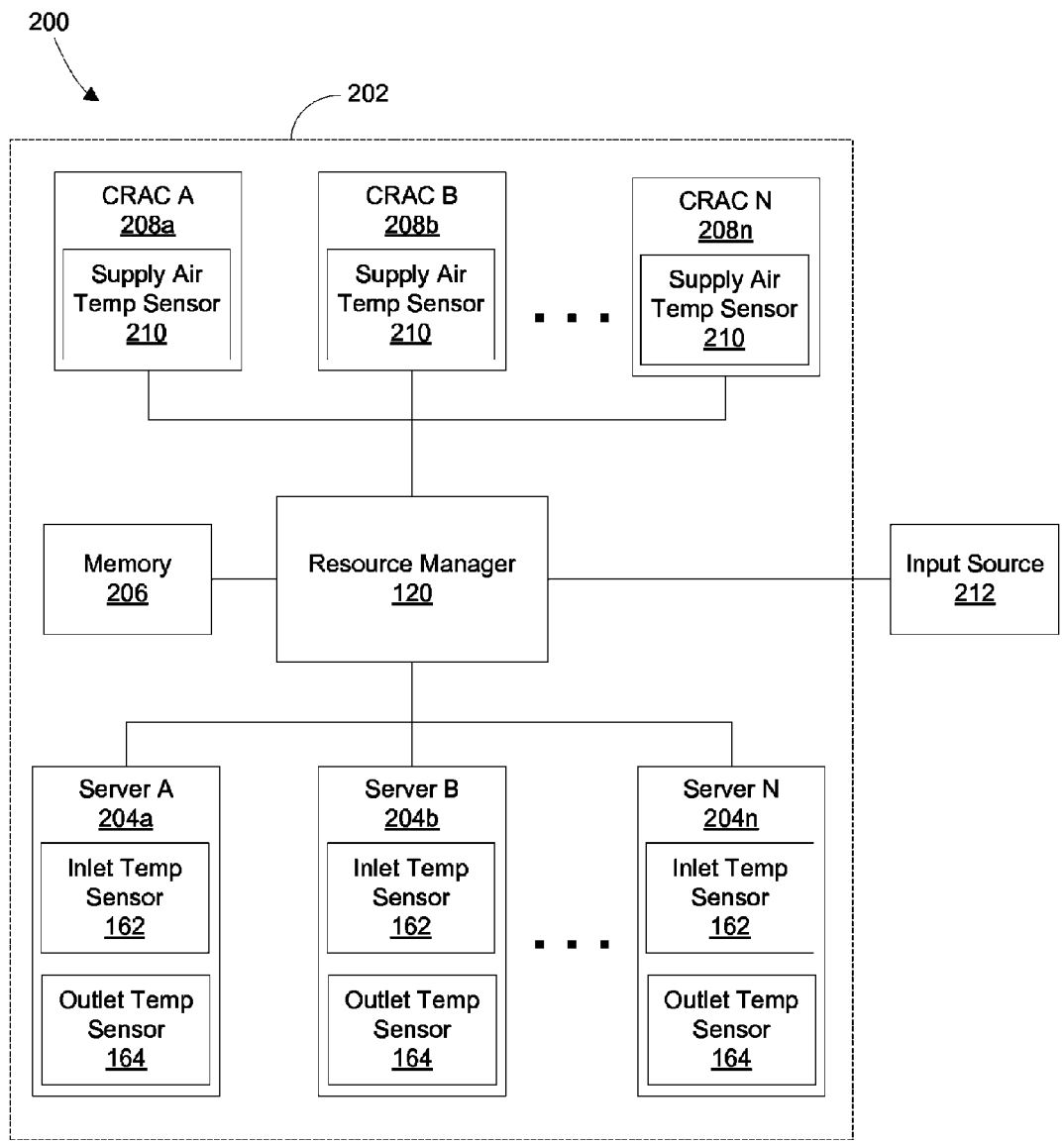
FIG. 3 is a system for migrating virtual machines in accordance with an exemplary embodiment of the invention.
Figure 4:
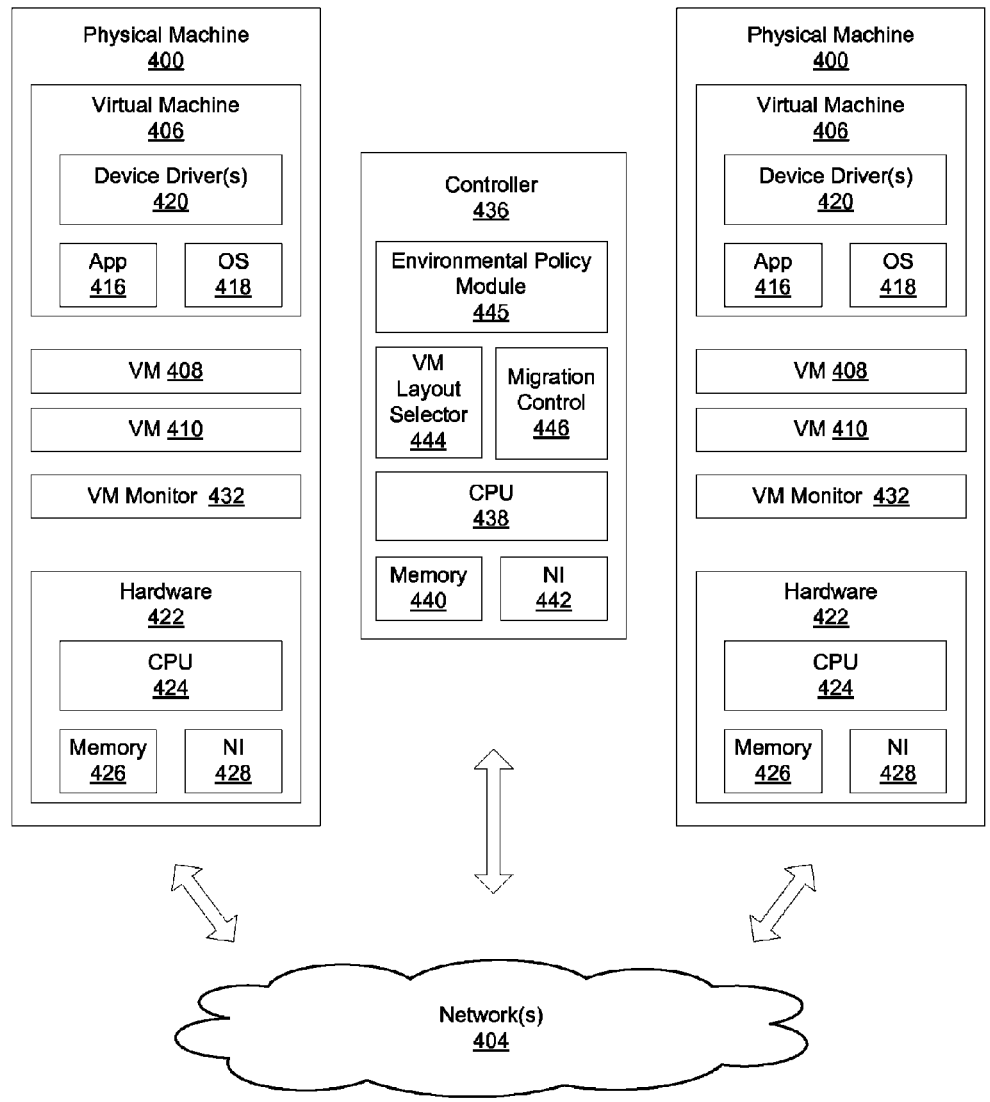
FIG. 4 is a system showing physical machines having virtual machines that are migrated in accordance with an exemplary embodiment of the invention.

In one embodiment, thermal imbalances are corrected by incorporating thermal monitoring and virtual machine placement policies into a resource manager or controller (as shown in FIGS. 3 and 4). The resource manager or controller monitors servers and storage components and determines real-time temperature distribution from variously positioned sensors in the data center. Through the workload placement policies implemented by the resource manager and/or controller, the servers and storage components in the data center are operated under a dynamic thermal management scheme designed to enable efficient cooling operation. In one regard, the dynamic thermal management scheme enables real-time and dynamic movement of virtual machines to promote uniform temperature distribution that reduces local hot spots, quickly responds to thermal emergencies, reduces energy consumption costs, reduces initial cooling system capital costs and improves equipment reliability.

Figure 1:
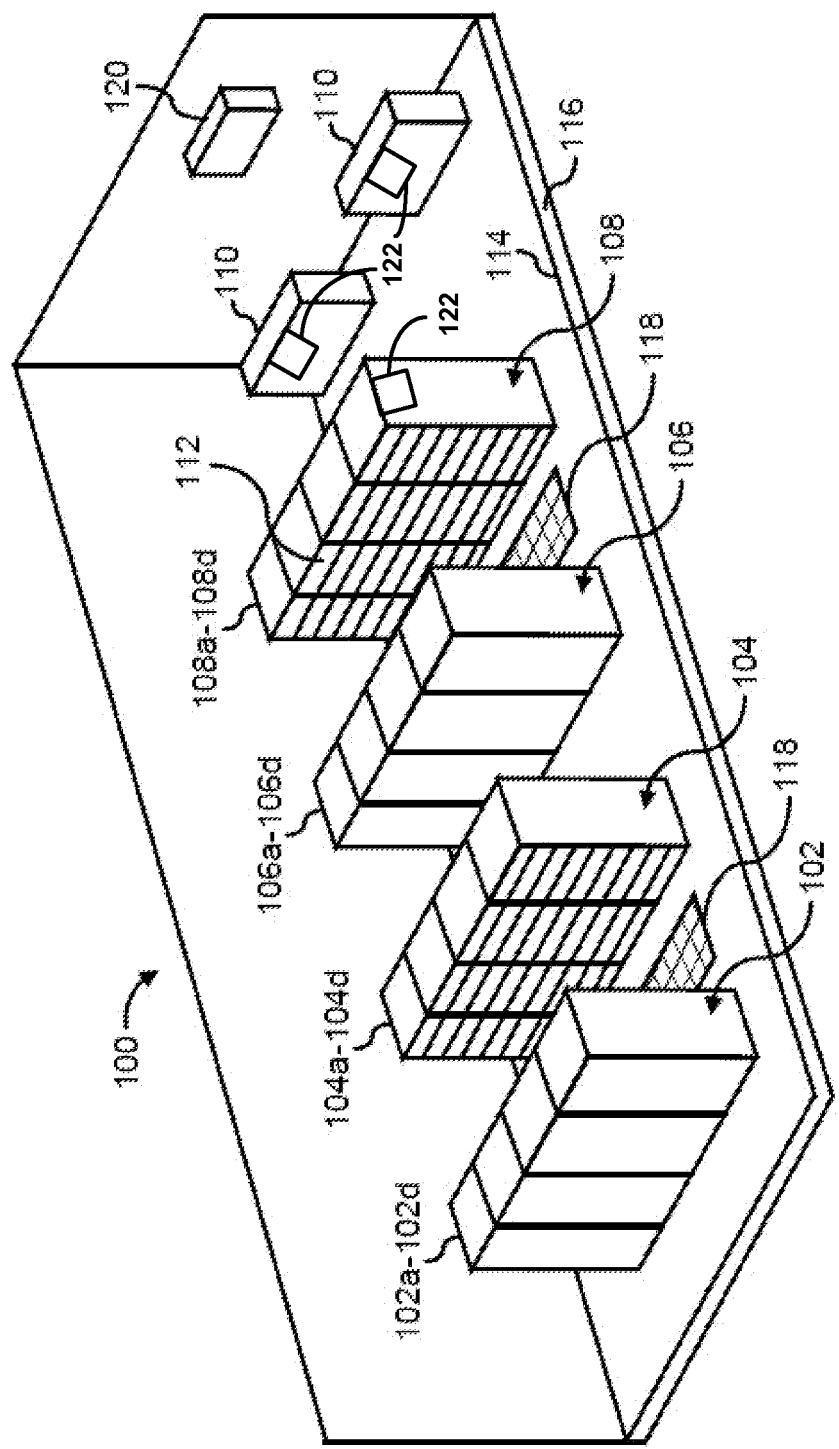
FIG. 1 is a data center in accordance with an exemplary embodiment of the invention.

FIG. 1 shows a simplified perspective view of a datacenter 100 which represents a generalized illustration since other components can be added or existing components can be removed or modified without departing from the scope of the invention. For example, the data center 100 includes any number of racks and various other apparatuses known to be housed in data centers. Thus, although the data center 100 is illustrated as containing four rows of racks 102-108 and two computer room air conditioning (CRAC) units 110, it should be understood that the data center 100 can include any number of racks and CRAC units. The depiction of four rows of racks 102-108 and two CRAC units 110 is thus for illustrative and simplicity of description purposes only and is not intended to limit the invention in any respect.

The data center 100 is depicted as having a plurality of racks 102-108, for instance, electronics cabinets, aligned in substantially parallel rows. The racks 102-108 are illustrated as having open front sides such that the components 112 housed therein are visible. It should, however, be understood that embodiments of the invention can be practiced with racks having panels that cover the front sides of the racks 102-108 without departing from a scope of the invention.

By way of example, the components 112 comprise one or more of computers, servers, monitors, hard drives, disk drives, etc., designed to perform various operations, for instance, computing, switching, routing, displaying, etc. These components 112 can also comprise subsystems (not shown), for example, processors, micro controllers, high-speed video cards, memories, semiconductor devices, and the like to perform these functions. In the performance of these electronic functions, the subsystems and therefore the components 112 generally generate relatively large amounts of heat. Because the racks 102-108 have generally been known to include upwards of 200 or more components 112, they can require substantially large amounts of cooling resources to maintain the subsystems and the components 112 generally within predetermined operating temperature ranges.

A relatively small number of components 112 are illustrated as being housed in the racks 102-108 for purposes of simplicity. It should, however, be understood that the racks 102-108 can include any number of components 112, for instance, forty or more components 112, or 200 or more blade systems. In addition, although the racks 102-108 are illustrated as containing components 112 throughout the heights of the racks 102-108, it should be understood that some of the racks 102-108 can include slots or areas that do not include components 112 without departing from the scope of the invention.

The rows of racks 102-108 are shown as containing four racks (a-d) positioned on a raised floor 114. A plurality of wires and communication lines (not shown) are located in a space 116 beneath the raised floor 114. The space 116 also functions as a plenum for delivery of cooling airflow from the CRAC units 110 to the racks 102-108. The cooled airflow is delivered from the space 116 to the racks 102-108 through a plurality of vent tiles 118 located between some or all of the racks 102-108. The vent tiles 118 are shown in FIG. 1 as being located between racks 102 and 104 and 106 and 108. One or more temperature sensors are positioned in the space 116 to detect the temperatures of the airflow supplied by the CRAC units 110.

The CRAC units 110 generally operate to receive heated airflow from the data center 100, cool the heated airflow, and deliver the cooled airflow into the plenum 116. The CRAC units 110 can comprise vapor-compression type air conditioning units, water-chiller type air conditioning units, etc. In one regard, the CRAC units 110 operate in manners generally consistent with conventional CRAC units 110. Alternatively, the CRAC units 110 and the vent tiles 118 operate to vary characteristics of the cooled airflow delivery as described, for instance, in commonly assigned U.S. Pat. No. 6,574,104, filed on Oct. 5, 2001, which is hereby incorporated by reference in its entirety.

Also illustrated in FIG. 1 is a resource manager and/or controller 120, depicted as an individual computing device. Although the resource manager 120 is illustrated as being separate from and located away from the racks 102-108, the resource manager 120 can also comprise a server or other computing device housed in one of the racks 102-108. In any regard, the resource manager 120 is generally configured to control various operations in the data center 100. For instance, the resource manager 120 controls workload placement by moving virtual machines among the various components 112, as described in greater detail hereinbelow. As another example, the resource manager 120 controls various operations of the CRAC units 110 and the vent tiles 118, collectively considered as the cooling system.

The cooling system also includes a plurality of sensors 122 that detect at least one environmental condition, for instance, temperature, pressure, humidity, airflow, etc. These sensors 122 comprise any reasonably suitable conventional sensors configured to detect one or more of these environmental conditions. The sensors are positioned at various locations in the data center 100. The sensors are positioned, for instance, to detect the temperature of the cooled airflow supplied by the CRAC units 110, the temperatures of the cooling fluid at the inlets of various racks 102-108, the temperatures of the cooling fluid at the outlets of various racks 102-108, etc. The sensors can comprise devices separate from the components 112 or they can comprise devices integrated with the components 112.

Figure 2:
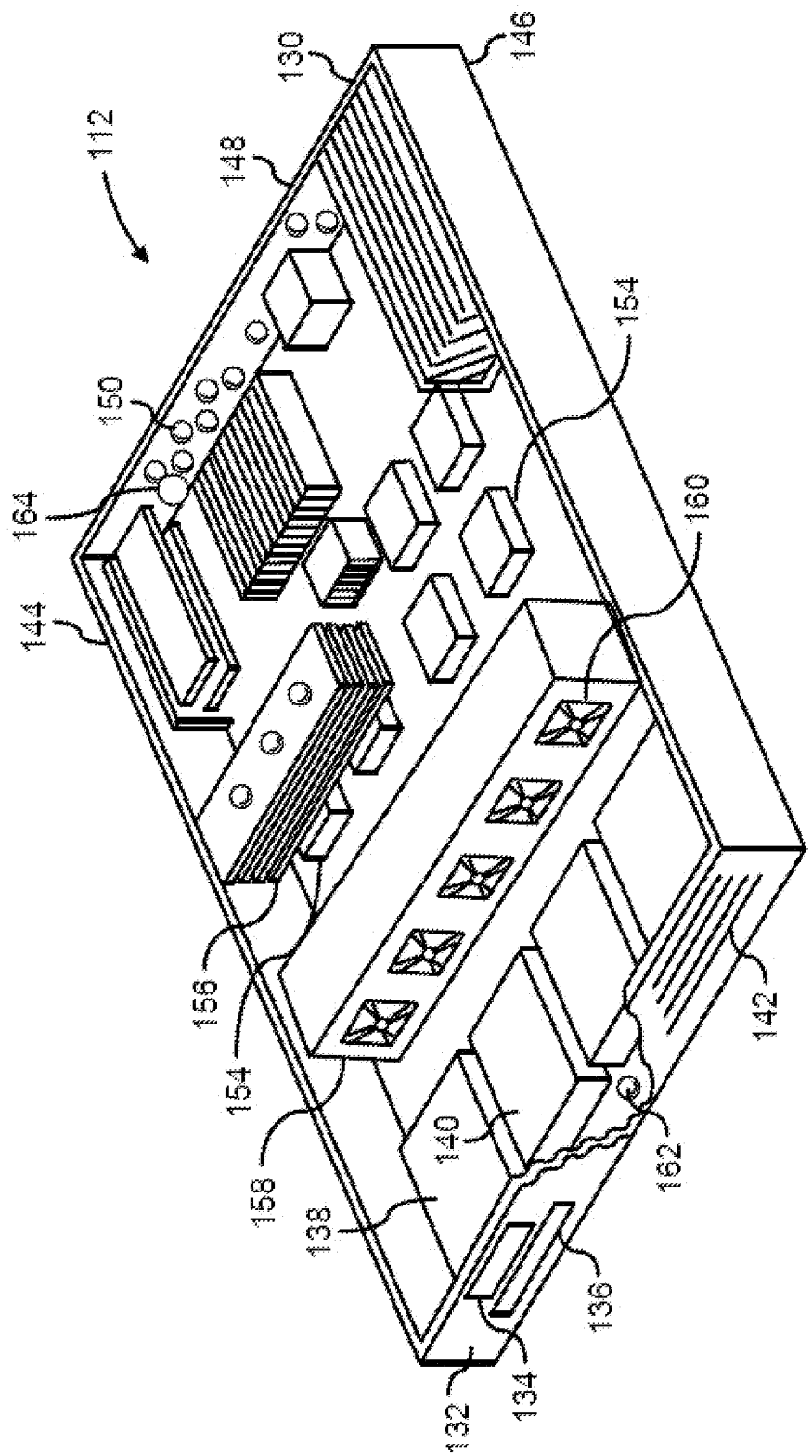
FIG. 2 is a server in accordance with an exemplary embodiment of the invention.

FIG. 2 is a perspective view of a component 112 that is housed in the racks 102-108 depicted in FIG. 1. By way of example, the component 112 depicted in FIG. 2 comprises a server that is mounted in the racks 102-108. In addition, the component 112 can comprise a server configured for substantially horizontal mounting in a rack 102-108 or a server configured for substantially vertical mounting in a rack 102-108, such as, a blade system. In any regard, the component 112 represents a generalized illustration and, therefore, other devices and design features can be added or existing devices or design features can be removed, modified, or rearranged without departing from the scope of the invention. For example, the component 112 can include various openings for venting air through an interior of the component 112. As another example, the locations of the various devices shown in the component 112 can be repositioned.

As shown in FIG. 2, the component 112 includes a housing 130 with a top section of the housing 130 removed for purposes of illustration. In addition, a part of a front section 132 of the housing 130 has been cut-away to more clearly show some of the devices contained in the component 112. The front section 132 is illustrated as containing various features to enable access to various devices contained in the component 112. For instance, the front section 132 is shown as including openings 134 and 136 for insertion of various media, for example, diskettes, flash memory cards, CD-Roms, etc. Located substantially directly behind the openings 134 and 136 are data storage devices 138 and 140 configured to read and/or write onto the various media. The front section 132 also includes vents 142 for enabling airflow into an interior of the housing 130.

The housing 130 also includes a plurality of side sections 144 and 146 and a rear section 148. The rear section 148 includes openings 150 to generally enable airflow out of the housing 130. Although not clearly shown in FIG. 2, the rear section 148 also includes openings for insertion of wires, cables, and the like into the housing 130 for connection to various devices contained in the housing 130. In addition, some of the openings 150 in the rear section 148 can include devices to enable the interfacing of certain devices contained in the housing 130 with various other electronic devices.

Contained within the housing 130 is a plurality of heat-generating devices 154. Some of the heat-generating devices 154 can comprise microprocessors, power converters, memory controllers, power supplies, disk drives, etc. In addition, some of the heat-generating devices 154 can include heat sinks 156 configured to dissipate relatively larger amounts of heat generated by these devices 154 by providing a relatively larger surface area from which heat can be dissipated through convection. Also illustrated in the component 112 is an optional fan cell 158 that is depicted as being composed of fans 160 for blowing air through the component 112.

The component 112 is also illustrated as including an inlet temperature sensor 162 and an outlet temperature sensor 164. As the names suggest, the inlet temperature sensor 162 detects the temperature of the airflow entering into the component 112 and the outlet temperature sensor 164 detects the temperature of the airflow exiting the component 112. The temperature sensors 162 and 164 can comprise any reasonably suitable temperature sensors, such as, thermocouples, thermistors, etc. In addition, the temperature sensors 162 and 164 can be integrally manufactured with the component 112 or the temperature sensors 162 and 164 can be installed in the component 112 as after-market devices.

In one embodiment, the temperature measurements obtained through use of the temperature sensors 162 and 164 are employed to determine environmental data of the component 112 or data center. More particularly, the resource manager 120 uses the environmental data to move virtual machines from one server to another server in the data center.

FIG. 3 is a block diagram 200 of a workload placement system 202 for moving virtual machines based on environmental conditions in a data center. It should be understood that the following description of the block diagram 200 is but one manner of a variety of different manners in which such a workload placement system 202 can be configured. In addition, it should be understood that the workload placement system 202 can include additional components and that some of the components described herein can be removed and/or modified without departing from the scope of the invention. For instance, the workload placement system 202 can include any number of sensors, servers, CRAC units, etc., as well as other components, which can be implemented in the operations of the workload placement system 202.

As shown, the workload placement system 202 includes the resource manager or controller 120 depicted in FIG. 1. The resource manager 120 comprises a computing device, for instance, a computer system, a server, etc. In addition, the resource manager 120 can comprise a microprocessor, a micro-controller, an application specific integrated circuit (ASIC), and the like (shown in more detail in FIG. 4) configured to perform various processing functions.

One of the processing functions of the resource manager 120 includes the balancing of workload among a plurality of components 112 based upon thermal considerations detected or occurring the data center. In this regard, the resource manager 120 receives environmental information (for example, temperature, air flow, humidity, etc.) for a plurality of components 112 and one or more CRAC units 110 and moves workloads through the virtual machines based upon the received information.

As shown in FIG. 3, the resource manager 120 is in communication with a plurality of servers (A-N) 204a-204n. The ellipses positioned between server (B) 204b and server (N) 204n generally indicate that the resource manager 120 can be in communication with any reasonably suitable number of servers. In any regard, the servers 204a-204n comprise some of the components 112 depicted in FIG. 1 and the component 112 depicted in FIG. 2.

Communications between the resource manager 120 and the servers 204a-204n is effectuated through use of any reasonably suitable known hardware and/or software configured to enable such communications. By way of example, the resource manager 120 and the servers 204a-204n can each include network adaptors (not shown) configured to enable wired or wireless information transfer between the resource manager 120 and the servers 204a-204n. In addition, or alternatively, either or both of the resource manager 120 and the servers 204a-204n can include software designed to enable the information transfer.

The resource manager 120 receives various types of information from the servers 204a-204n. For instance, the resource manager 120 receives identifying information of the servers 204a-204n, the locations of the servers 204a-204n, sensed temperatures, etc. The resource manager 120 can also receive information pertaining to the devices contained in the servers 204a-204n. This information can include, for instance, the types and numbers of processors, data storage capabilities, etc. In addition, or alternatively, the resource manager 120 can access this type of information from a database (not shown) stored, for instance, in a memory 206. The memory 206 can comprise a traditional memory device, such as, volatile or non-volatile memory, such as DRAM, EEPROM, flash memory, combinations thereof, and the like.

The resource manager 120 is also in communication with one or more CRAC units (A-N) 208a-208n. The ellipses positioned between CRAC unit (B) 208b and CRAC unit (N) 208n generally indicate that the workload placement system 202 includes any reasonably suitable number of CRAC units. In any regard, the CRAC units 208a 208n comprise one or more of the CRAC units 110 depicted in FIG. 1. Although the workload placement system 202 is depicted as including three or more CRAC units 208a 208n, the workload placement system 202 can also operate with a single CRAC unit 208a. Thus, it should be appreciated that the depiction of three or more CRAC units 208a-208n is to illustrate and describe certain features of the workload placement system 202 but is not intended to limit the workload placement system 202. In addition, reference is made to the CRAC units 208a-208n for purposes of illustration and not to limit the workload placement system 202 in any respect.

The resource manager 120 and the CRAC units 208a-208n communicate through use of any reasonably suitable known hardware and/or software. By way of example, the resource manager 120 and the CRAC units 208a-208n each include network adaptors (not shown) to enable wired or wireless information transfer between the resource manager 120 and the CRAC units 208a-208n. In addition, or alternatively, either or both of the resource manager 120 and the CRAC units 208a-208n can include software designed to enable the information transfer.

The resource manager 120 can also receive various types of information from the CRAC units 208a-208n. For instance, the resource manager 120 can receive information pertaining to the identifications of the CRAC units 208a-208n, the locations of the CRAC units 208a-208n, sensed temperature, etc. The resource manager 120 can also receive information pertaining to the cooling capacities of the CRAC units 208a-208n. The cooling capacities can pertain to, for instance, the operational limits of the CRAC units 208a-208n as rated by the manufacturers of the CRAC units 208a-208n or as determined through testing of the CRAC units 208a-208n. In addition, or alternatively, the resource manager 120 accesses this type of information from a database (not shown) stored, for instance, in the memory 206.

As further shown in FIG. 2, the servers 204a-204n contain respective inlet temperature sensors 162 and outlet temperature sensors 164, which can comprise any reasonably suitable temperature sensors, such as, thermocouples, thermistors, etc. As described hereinabove with respect to FIG. 2, the inlet temperature sensors 162 detect the respective temperatures of airflow entering into the servers 204a 204n and the outlet temperature sensors 164 detect the respective temperatures of airflow exiting the servers 204a-204n.

The temperature measurements obtained by the inlet temperature sensors 162 and the outlet temperature sensors 164 of the respective servers 204a-204n are communicated to the resource manager 120. Temperature measurements obtained by supply air temperature sensors 210 of respective CRAC units 208a-208n are also communicated to the resource manager 120. The supply air temperature sensors 210 are generally configured to detect the temperatures of the cooled airflow supplied by respective CRAC units 208a-208n. In one respect, the temperature sensors 210 are included in respective CRAC units 208a 208n and are positioned to detect the airflow temperatures as the cooled airflow is delivered into the space 116 (FIG. 1). In another example, the supply air temperature sensors 210 are positioned in the space 116 to detect the temperatures of the airflow contained in the space 116. As a yet further example, the supply air temperature sensors 210 are positioned near vent tiles 118 to detect the temperatures of the of the airflow supplied through respective vent tiles 118.

The illustration of the supply air temperature sensors 210 forming part of respective CRAC units 208a-208n is to depict the correlation between the respective CRAC units 208a-208n and sensors configured to detect the temperatures of the airflow supplied by the respective CRAC units 208a-208n. Thus, the supply air temperature sensors 210 should not be construed as necessarily forming part of the CRAC units 208a-208n.

The resource manager 120 can also communicate with an input source 212, which can comprise various types of input sources. For instance, the input source 212 can comprise the Internet, an internal network to which the resource manager 120 is attached, a physical input device (such as a computer system, a keyboard, a mouse, a stylus, etc.), etc. In general, the input source 212 is defined as any source capable of providing instructions and/or data to the resource manager 120. By way of example, the input source 212 is used as a means to request that the resource manager 120 select a server 204a-204n to perform an application. In certain instances, the request is transparent to a user of the input source 212. For instance, a user can submit a request for performance of a service or application over the Internet and the resource manager 120 receives and processes the request as described below. In any regard, the resource manager 120 can communicate with the input source 212 via an Ethernet-type connection or through a wired protocol, such as IEEE 802.3, etc., or wireless protocols, such as IEEE 802.11b, 802.11 g, wireless serial connection, Bluetooth, etc., or combinations thereof.

In terms of processing the request, the resource manager 120 moves one or more virtual machines to one or more servers and determines and selects the one or more servers to perform the requested service or application based substantially upon real-time thermal conditions determined in the data center. The process by which the resource manager 120 makes this determination is described in greater detail with respect to FIG. 5.

FIG. 4 shows a computer system that includes two or more physical machines or servers 400 and a controller or resource manager 436. Examples of the physical machines include computers (e.g., application servers, storage servers, web servers, etc.), communications modules (e.g., switches, routers, etc.), and other types of machines. By way of example, the physical machines represent the servers or components discussed in FIGS. 1-3. Further, "physical machine" indicates that the machine is an actual machine made up of software and hardware. Although each of the physical machines is depicted as being contained within a box, it is noted that a physical machine can be a distributed machine having multiple nodes that provide a distributed and parallel processing system.

Within each of the physical machines are various virtual machines (VMs). In the example of FIG. 4, three virtual machines 406, 408, and 410 are depicted in the physical machine 400. Note that the numbers of virtual machines in each physical machine shown in FIG. 4 are provided for purposes of example, as different implementations can employ different numbers (one or more) of virtual machines in the corresponding physical machines.

A virtual machine refers to some partition or segment (made up of software and/or hardware) of the physical machine that is provided to virtualize or emulate a physical machine. From the perspective of a user, a virtual machine looks just like a physical machine. As depicted in FIG. 4, according to some embodiments, the virtual machine 406 includes one or more software applications 416, an operating system (OS) 418, and one or more device drivers 420 (which are typically part of the operating system 418). The other virtual machines can also contain software applications, operating systems, and device drivers (such devices not being shown for simplicity).

It is noted that the operating systems that are part of corresponding virtual machines within a physical machine can be different types of operating systems or different versions of an operating system. This allows software applications designed for different operating systems to execute on the same physical machine.

In accordance with some embodiments, one or more placement controllers or resource managers 436 are provided on one or more networks 404 to provide automated management of the placement of virtual machines in corresponding physical machines 400 (and any other physical machines in the system depicted in FIGS. 1-4). In the ensuing discussion, reference is made to just one placement controller 436; however, note that the tasks of the one placement controller 436 can be performed by multiple placement controllers.

The virtual machines within a physical machine are designed to share the physical resources of the physical machine. In the physical machine, these physical resources include the hardware 422 of the physical machine 400, which hardware 422 includes one or more central processing units (CPUs) 424, memory (volatile memory and/or persistent storage, such as disk-based storage) 426, a network interface (NI) 428, and other resources (such as a storage area network interface, not shown).

The physical machine 400 also includes a virtual machine monitor (VMM) 432, also called a hypervisor, which manages the sharing (by virtual machines 406, 408, 410) of the physical resources, including the hardware 422, of the physical machine 400. The VMM 432 virtualizes the physical resources, including the hardware 422, of the physical machine 400. Also, the VMM 432 intercepts requests for resources from operating systems in the respective virtual machines 406, 408, 410 so that proper allocation of the physical resources of the physical machine 400 can be performed. For example, the VMM 432 manages memory access, input/output (I/O) device access, and CPU scheduling for the virtual machines. Effectively, the VMM 432 provides an interface between the operating system of each virtual machine and the underlying hardware 422 of the physical machine 400. The interface provided by the VMM 432 to an operating system of a virtual machine is designed to emulate the interface provided by the actual hardware of the physical machine 400.

In accordance with some embodiments, one or more placement controllers 436 are provided on the network 404 to provide automated management of the placement of virtual machines in corresponding physical machines 400 (and any other physical machines in the system depicted in FIG. 4) based on current environmental conditions in the data center.

The placement controller 436 is able to determine an efficient placement of the virtual machines on corresponding physical machines based on predefined criteria (according to a target policy set by an enterprise, a user, an administrator, etc.). The predefined criteria according to the policy are not limited to environmental data but can include one or more of a target quality-of service level to be provided, loading criteria (which specify some target loading level on a physical resource or machine), balancing criteria (which specify that load on physical machines should balanced when possible), cooling criteria (which specify temperatures in physical machines that should not be exceeded), power criteria (which specify that power consumption should be reduced where possible), environmental criteria (which specify one or more environmental conditions in the data center, such as temperature, humidity, air flow, etc.), and other criteria.

The placement controller 436 is able to determine whether the current state of the overall system (which includes the multiple physical machines) conforms to the policy. If the placement controller 436 determines that the state of the system does not conform to the policy, then the placement controller 436 can perform an evaluation to determine a different placement of virtual machines on physical machines to increase conformance to the policy.

If a different placement is determined by the placement controller 436 to be desirable, the placement controller 436 is able to perform migration or movement of virtual machines from one physical machine to another physical machine. After placement of the virtual machines has been changed (by migration), the placement controller 436 can subsequently determine whether further migration should be performed. Note that workloads at the physical machines and environmental conditions in the data center are continually changing. The placement controller 436 repeatedly, continuously, or periodically checks (in a loop) whether the state of the system conforms to policy. Additionally, the placement controller 436 can asynchronously check whether the state of the system conforms to policy in response to Quality of Service (QoS) or sensor problem notification events. In effect, the placement controller 436 provides a feedback-driven mechanism to control the mapping of virtual machines onto physical machines. This feedback-driven mechanism allows automated adjustments of placement of the virtual machines on physical machines. By automating the virtual machine placement control, relatively quick response times can be achieved in changing placements of virtual machines in response to observed or predicted events that affect conformance with policy.

In one embodiment, computing an optimal solution to the problem of placement of virtual machines on physical machines in the system is NP-hard (non-deterministic polynomial-time hard). Moreover, a further complication with respect to the virtual machine placement problem is that resource constraints are not fixed, such as due to continual changes that are experienced by physical machines (e.g., workloads of the physical machines constantly changing due to applications being launched or applications being closed, traffic conditions changing, etc.). For instance, the resource demand in the virtual machines changes such that the generally static capacities of the underlying physical machines may exceed maximum thresholds or saturate at 100%. Consequently, even though an optimal solution for the placement problem can be identified for a particular instant in time, this solution may no longer be optimal at some later instant in time. By providing a feedback-driven mechanism in accordance with some embodiments, the solution to the virtual machine placement problem can be continually changed as resource constraints change over time.

The term "optimal solution" can include a globally optimal solution (the best solution among all possible solutions) or a locally optimal solution (the best solution among a subset of all possible solutions). Also, the term "optimal solution" can refer to either an exact optimal solution or an approximate optimal solution.

As depicted in FIG. 4, the placement controller 436 includes one or more CPUs 438 and memory 440. Also, a network interface 442 is provided in the placement controller 436 to allow communication between the placement controller 436 and the network 404.

The placement controller 436 also includes a VM layout selector 444 (to perform selection of a layout of the virtual machines mapped to physical machines), in accordance with some embodiments. Additionally, the placement controller 436 includes a migration control module 446 to control migration of virtual machines from one physical machine to another physical machine (in accordance with the layout selected by the VM layout selector 444). Also, the placement controller 436 can include an environmental policy module 445 for determining whether certain virtual machines can be migrated or moved to physical machines based on current or real-time environmental conditions in the data center. In some implementations, the VM layout selector 444, environmental policy module 445, and migration control module 446 are software modules executable on the CPU 438 of the placement controller 436.

During operation, temperatures in physical machines can exceed a temperature threshold. If this occurs, then migration of virtual machines from the over-heated physical machines can be desirable. This migration decreases load that reduces generated heat some, or additionally allowing things like processor p-states to be changed that can decrease generated heat more significantly. Cooling criteria can also specify cooling costs. In large data centers, for example, sophisticated cooling equipment is usually provided to cool physical machines. To reduce cooling costs, migration of virtual machines can be performed in a manner that allows some part of the cooling equipment to be turned off (or run in a lower power mode). In one example, virtual machines are moved from one or more servers to other servers based on environmental conditions in the data center, such as local cooling capacity, temperature, air flow, etc. This movement enables one or more physical machines to be turned off (or placed in a lower power state), such that corresponding cooling equipment can be shut off (or run in a lower power mode). The lower power state of a physical machine refers to any one of several possible power savings states of such machines, including sleep states, standby states, hibernation states, and so forth.

As noted above, the placement problem for identifying an optimal solution for placement of virtual machines on physical machines is a relatively complex problem. For a large system having many physical machines and virtual machines, the computation time for identifying the optimal placement of virtual machines can be very large. In accordance with an embodiment, a simulated annealing technique is used to find an approximation of a globally optimal placement of virtual machines on physical machines. Generally, simulated annealing considers a current set (that represents some random placement of virtual machines on physical machines), and iteratively adjusts the current set until a better set can be identified. The simulated annealing algorithm attempts to replace a current solution with a random "nearby" solution. In one embodiment, the simulated annealing aspect of simulated annealing means that there is a probability that "worse" solutions are adopted that decreases as the algorithm proceeds. This enables the algorithm to not necessarily get stuck on a local minimum/maximum early on as would otherwise occur if only the current best solution was used. Towards the end of the algorithm, worse solutions become highly improbable (going to zero) thus allowing the algorithm to "climb" whatever hill (hopefully the highest) that it has found itself on.

The simulated annealing algorithm performed by the VM layout selector 444 is based on a cost function (alternatively referred to as a "goodness function") that takes into account various constraints that represent the predefined criteria described above. The cost function is represented by some aggregation of terms, where each term is multiplied by a weight factor. Generally, the cost function has the form: $f=W_1 \times t_1 + W_2 \times t_2 + \ldots$, where the $t_i$ terms (i=1 to N) represent corresponding criteria (N total criteria, where N is an integer) to be considered, and the w, parameters represent weights to be applied to the terms. As examples, the $t_i$ terms can represent resource loading criteria (n terms to correspond to the n dimensions of resources), balancing criteria, cooling criteria, power criteria, environmental criteria, and so forth. The weight to be multiplied to each term generally represents the importance of the corresponding term in computing the goodness rating for a particular layout of virtual machines.

The weights in some cases can be set (or otherwise influenced) by a user. For example, the controller 436 can present a graphical user interface (GUI) screen that provides various fields in which the user can input values corresponding to weights to be applied to various terms. In an alternative implementation, the weights can be input to the controller 436 by some other technique, such as in a file. Other weights can be hardcoded into the VM layout selector 444.

Each of the terms in the cost function is based on parameters measured or estimated by the VM layout selector 444. For example, parameters relating to current environmental conditions in the data center at a given point in time and for a given layout of virtual machines can be measured or estimated. Note that the parameters corresponding to the current layout (the layout that is currently being used) can be measured by the VM layout selector 444. However, when considering alternative layouts (which are trial layouts not yet implemented) to compare to the current layout, the parameters for the alternative layouts may have to be estimated (using an internal model provided with the VM layout selector 444), where the model can be generated based on historical information and incorporate predictions made from this historical data. In other words, it will take some amount of time to move from a current layout to a new layout. For this new layout to be good requires predicting what the world will look like at the time the new layout is in place. The longer the time it takes to change the layout, the farther out and better the predictions must be. The measured or estimated parameters are then translated to the terms of the cost function. Thus, for each given layout of virtual machines, the cost function outputs a goodness rating indicator.

Figure 5:
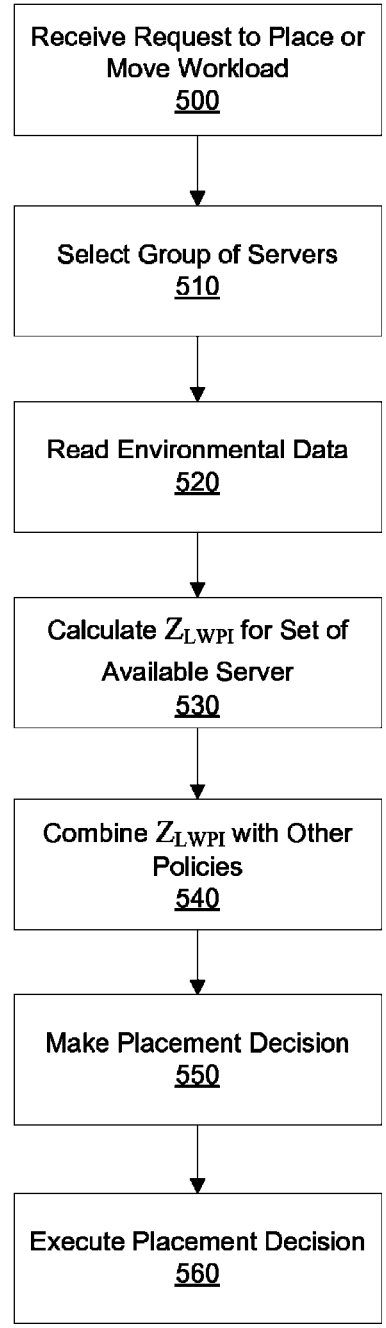
FIG. 5 is a flow diagram for migrating virtual machines according to environmental conditions in accordance with an exemplary embodiment of the invention.

FIG. 5 is a flow diagram for migrating virtual machines according to environmental conditions in accordance with an exemplary embodiment of the invention.

According to block 500, a request is received to place or move one or more workloads. By way of example, the controller or resource manager selects a group of servers that are capable of performing the requested workload, as indicated at block step 510. In addition, the resource manager or controller receives or reads environmental conditions existing in the data center according to block 520 and then calculates a server workload indexes (SWI's) for the servers in a selected group of servers according to block 530. Any suitable environmental index can be used. By way of example, this server workload index is a Local Workload Placement Index (LWPI) or a Zone-based Local Workload Placement Index ($Z_{LWPI}$) in the data center. Then at block 540, the workload index (for example, the $Z_{LWPI}$) is combined with one or more other policies. At block 550, the resource manager or controller migrates virtual machines to place the requested workload on one or more of the servers based upon the calculated workload index for the servers. The workload is then executed according to block 560. Thereafter, the process can be re-initiated, for instance, when the resource manager receives another workload request.

In one embodiment, the operational mode is initiated or started through receipt of a workload request by the resource manager. The workload request can be in the form of a resource specification language (RSL). The RSL can include a description of the services required by a particular application. The resource manager can be configured to determine which specific resources and their quantities are needed to perform the required services of the requested workload, which can be considered as a ground RSL.

In general, the ground RSL can specify that a certain number of servers or virtual machines in the servers having predefined architectures operable to run for a predefined period of time are required to perform a particular workload. Based upon, for instance, the requirements of the requested workload, the resource manager can select a group of servers that are capable of performing the requested workload. For instance, the resource manager can determine which of the servers are equipped with suitable hardware (for instance, memory capacity, processors, etc.) and software (for instance, VMs, operating systems, suitable applications, etc.) to perform the requested workload. In selecting the group of servers, the resource manager can also consider additional factors. For instance, the resource manager can determine whether the CRAC unit(s) are near or are exceeding their rated cooling capacities. Thus, the resource manager 120 can exclude servers from the group that are substantially directly cooled by CRAC unit(s) that are operating near or above their rated capacities.

The resource manager can determine the capabilities of the servers either before or after the workload request is received. If the resource manager makes this determination prior to receipt of the workload request, the resource manager can store this information in the memory.

In one embodiment, the resource manager also collects the inlet and outlet temperatures for the servers in the selected group of servers. In addition, the resource manager can collect the supply air temperatures for one or more CRAC units, the supply air temperature(s) from supply air temperature sensors, and other environmental data.

By way of example, the resource manager uses the collected inlet and outlet temperatures of the servers and the supply air temperatures of the CRAC units to calculate Supply Heat Indexes (SHIs) of the servers. The SHIs of the servers is defined as a scalable "indexes of performance" that quantifies the amount of re-circulation occurring at the servers. In other words, SHI can act as an indicator of thermal management and energy efficiency of the thermal environment near a server.

The SHI of the servers can be used to determine the level, if any, of heated airflow re-circulation into the cooled airflow supplied to the servers. The general concepts of SHI is described in greater detail in commonly assigned U.S. patent application Ser. No. 10/446,854, filed on May 29, 2003, entitled "Air Re Circulation Index", the disclosure of which is hereby incorporated by reference in its entirety.

In one exemplary embodiment, the Local Workload Placement Index for server i in a data center is calculated as taught in U.S. patent application having Ser. No. 11/590,525 filed Oct. 31, 2006 and being incorporated herein by references. In one embodiment, the Zone-based LWPI considers neighboring servers in the formulation of the metric and, by doing so, utilizes zone-based environmental control systems.

In one embodiment, the resource manager or controller performs sophisticated placement decisions based upon user specifiable policies. The controller uses one or more mathematical cost functions that evaluates the quality of a data center arrangement, and a solver that evaluates some subset of all possible data center arrangements looking for the lowest cost arrangement. It is possible to add additional terms (with appropriate weights) to the function which incorporate the $Z_{LWPI}$ for all of the physical machines (for example, using dynamic environmental information such as cooling, temperature, air flow, etc.).

By way of example, one embodiment utilizes a policy that balances CPU load. Assume a datacenter configuration with the following: (1) three identical physical hosts with 1 processor, (2) the $Z_{LWPI}$ for the physical hosts are 1, 2 and 3, where a higher number is better, (3) two virtual machines, each which consumes 30% of a single processor, (4) a simple solver that uses brute force to search all mappings of virtual machines to physical machines to find the optimal mapping, and (5) a mapping is represented as a pair of numbers (p1, p2) where the first number is the physical host for VM1 and the second number is the physical host for VM2.

The pseudo-code for a cost function which would balance the load is:

Function cost(mapping):

Average_load = sum_vm_loads() / number_of_pms;

Cost = 0.0

For *PM* in physical_machines

*PMload* = compute_PM_load(mapping)

Cost = Cost + absolute_value(average − *PMload*)

Return cost

For this example, there are only six possible layouts, which are listed in Table 1 with their associated costs (note that average load=20 (30+30/3):

TABLE 1

| Layout | PM1 cost | PM2 cost | PM3 cost | Total cost |
|---|---|---|---|---|
| (1, 1) | 60 − 20 = 40 | 0 − 20 = 20 | 0 − 20 = 20 | 80 |
| (2, 2) | 0 − 20 = 20 | 60 − 20 = 40 | 0 − 20 = 20 | 80 |
| (3, 3) | 0 − 20 = 20 | 0 − 20 = 20 | 60 − 20 = 40 | 80 |
| (1, 2) | 20 − 10 = 10 | 20 − 10 = 10 | 0 − 20 = 20 | 40 |
| (1, 3) | 20 − 10 = 10 | 0 − 20 = 20 | 20 − 10 = 10 | 40 |
| (2, 3) | 0 − 20 = 20 | 20 − 10 = 10 | 20 − 10 = 10 | 40 |

The solver checks all values, and return a layout that results in the minimum cost, in the example, one of the last three layouts, all of which are equally balanced.

The pseudo-code for a cost function that balances load on the machines while favoring those with the lowest $Z_{LWPI}$ is as follows:

Function cost(mapping):

Average_load = sum_vm_loads() / number_of_pms;

Cost = 0.0

For *PM* in physical_machines

*PMload* = compute_PM_load(mapping)

Cost = Cost + absolute_value(average − *PMload*) −

$\quad\quad\quad PMload / 100 * getZ1wpi(PM)$

Return cost

This pseudo-codes results in the following Table 2:

TABLE 2

| Layout | PM1 cost | PM2 cost | PM3 cost | Total cost |
|---|---|---|---|---|
| (1, 1) | 60 − .6 − 20 = 40.6 | 0 − 20 = 20 | 0 − 20 = 20 | 79.4 |
| (2, 2) | 0 − 20 = 20 | 60 − 1.2 − 20 = 41.2 | 0 − 20 = 20 | 78.8 |
| (3, 3) | 0 − 20 = 20 | 0 − 20 = 20 | 60 − 1.8 − 20 = 41.8 | 78.2 |
| (1, 2) | 20 − .3 − 10 = 10.3 | 20 − .6 − 10 = 10.6 | 0 − 20 = 20 | 39.1 |
| (1, 3) | 20 − .3 − 10 = 10.3 | 0 − 20 = 20 | 20 − .9 − 10 = 10.9 | 38.8 |
| (2, 3) | 0 − 20 = 20 | 20 − .6 − 10 = 10.6 | 20 − .9 − 10 = 10.9 | 38.5 |

The pseudo-code adding the $Z_{LWPI}$ term has changed the costs, and the controller now chooses layout (2,3), which has the load balanced on the machines with the most favorable $Z_{LWPI}$. If it was desired to favor $Z_{LWPI}$ over balance, the term PMload/100*getZlwpi(PM) could be changed to PMload*getZlwpi(PM) (where the 100 here is one of the weight factor "w" mentioned above).

Alternative embodiments could use algorithms more sophisticated than brute force, including stochastic algorithms or gaming algorithms such as alpha/beta pruning, and the cost function could include many more terms, including memory load, disk load, network load, power data, etc.

Exemplary embodiments combine environmental policies for workload placement with algorithms for the virtualization of computational resources. Exemplary embodiments enable improved energy efficiency, improved air conditioning operating capacity, and improved computational equipment reliability.

Definitions: As used herein and in the claims, the following words and terms are defined as follows:

The term "data center" means a facility (such as a room or space) that houses computer systems and associated components, such as telecommunications and storage systems. Data centers often include redundant or backup power supplies, redundant data communications connections, and environmental controls (e.g., air conditioning).

The term "physical machine" means a computer or machine that is an actual computer or machine made up of software and hardware.

The term "virtual machine" means some partition or segment (made up of software and/or hardware) of a physical machine that is provided to virtualize or emulate a physical machine.

In one exemplary embodiment, one or more blocks or steps discussed herein are automated. In other words, apparatus, systems, and methods occur automatically. As used herein, the terms "automated" or "automatically" (and like variations thereof) mean controlled operation of an apparatus, system, and/or process using computers and/or mechanical/electrical devices without the necessity of human intervention, observation, effort and/or decision.

The methods in accordance with exemplary embodiments of the present invention are provided as examples and should not be construed to limit other embodiments within the scope of the invention. For instance, blocks in diagrams or numbers (such as (1), (2), etc.) should not be construed as steps that must proceed in a particular order. Additional blocks/steps can be added, some blocks/steps removed, or the order of the blocks/steps altered and still be within the scope of the invention. Further, methods or steps discussed within different figures can be added to or exchanged with methods of steps in other figures. Further yet, specific numerical data values (such as specific quantities, numbers, categories, etc.) or other specific information should be interpreted as illustrative for discussing exemplary embodiments. Such specific information is not provided to limit the invention.

In the various embodiments in accordance with the present invention, embodiments are implemented as a method, system, and/or apparatus. As one example, exemplary embodiments and steps associated therewith are implemented as one or more computer software programs to implement the methods described herein (such as being implemented in a server or controller). The software is implemented as one or more modules (also referred to as code subroutines, or "objects" in object-oriented programming). The location of the software will differ for the various alternative embodiments. The software programming code, for example, is accessed by a processor or processors of the computer or server from long-term storage media of some type, such as a CD-ROM drive or hard drive. The software programming code is embodied or stored on any of a variety of known media for use with a data processing system or in any memory device such as semiconductor, magnetic and optical devices, including a disk, hard drive, CD-ROM, ROM, etc. The code is distributed on such media, or is distributed to users from the memory or storage of one computer system over a network of some type to other computer systems for use by users of such other systems. Alternatively, the programming code is embodied in the memory and accessed by the processor using the bus. The techniques and methods for embodying software programming code in tangible physical memory or media, and/or distributing software code via networks are well known and will not be further discussed herein.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method, comprising:
receiving, at a controller, temperature data for servers in a data center, wherein receiving the temperature data comprises receiving inlet and outlet temperatures of the servers;
migrating, by the controller, a virtual machine from a first server to a second server to reduce a temperature at the first server;
collecting supply air temperatures for one or more computer room air conditioning (CRAC) units in the data center;
using, by the controller, the supply air temperatures and the inlet and outlet temperatures to determine an area in the data center to move the virtual machine to reduce cooling costs for the data center.

2. The method of claim 1 further comprising, calculating a Zone-based Local Workload Placement Index (ZLWPI) to determine where to move the virtual machine in the data center.

3. The method of claim 1 further comprising,
calculating thermal multipliers for different groups of servers, the thermal multipliers estimating an ability of servers to accept new workloads;
using the thermal multipliers to determine where to move the virtual machine to reduce cooling costs in the data center.

4. The method of claim 1 further comprising:
receiving, at the controller, real-time cooling data and real-time airflow data for the data center;
using the real-time cooling data and the real-time airflow data to determine which server in the data center receives the virtual machine.

5. The method of claim 1 further comprising, searching all mappings of plural virtual machines to the servers to find a location to migrate the virtual machine.

6. A non-transitory computer readable medium having instructions for causing a computer to:
receive inlet and outlet temperatures of servers in a data center;
receive supply air temperatures of plural computer room air conditioning (CRAC) units in the data center;
migrate virtual machines among the servers to increase cooling efficiency in the data center, wherein the migrating is based on the inlet and outlet temperatures and the air supply temperatures.

7. The non-transitory computer readable medium of claim 6, wherein the instructions cause the computer to further calculate a Zone-based Local Workload Placement Index (ZLWPI) to determine where to move the virtual machines in the data center.

8. The non-transitory computer readable medium of claim 6, wherein the instructions cause the computer to further:
calculate workload indexes for the servers;
use the workload indexes to determine where to move the virtual machines in the data center.

9. The non-transitory computer readable medium of claim 6, wherein the instructions cause the computer to further assess impact on thermal conditions in the data center after migrating the virtual machines.

10. The non-transitory computer readable medium of claim 6, wherein the instructions cause the computer to further:
receive the inlet and outlet temperatures and the supply air temperatures from corresponding sensors distributed in the data center.

11. The non-transitory computer readable medium of claim 6, wherein the instructions cause the computer to further:
determine a Local Workload Placement Index (LWPI) for the servers, the LWPI based upon one or more of a thermal management margin, a fluid moving device margin, a thermal correlation index, and a recirculation level at each electronic device;
use the LWPI to determine where to migrate the virtual machines to reduce cooling costs in the data center.

12. A data center, comprising:
plural servers to execute virtual machines;
plural sensors to sense environmental data in the data center, the environmental data including inlet and outlet temperatures of the servers and supply air temperatures of room air conditioning units; and
a resource manager to receive the environmental data and migrate, based on the inlet and outlet temperatures and the supply air temperatures in the environmental data, the virtual machines among the servers to increase cooling efficiency in the data center.

13. The data center of claim 12, wherein the resource manager is to calculate a Zone-based Local Workload Placement Index (ZLWPI) to determine where to move the virtual machines in the data center using the ZLWPI.

14. The data center of claim 12, wherein the resource manager is to calculate server workload indexes based on the inlet and outlet temperatures, and use the server workload indexes to determine how to distribute the virtual machines in the data center.

15. The data center of claim 12, wherein the resource manager is to calculate supply heat indexes of the servers to determine where to migrate the virtual machines in the data center.

16. The data center of claim 12, wherein the resource manager is to search all mappings of the virtual machines to the servers to find a location in the data center to migrate the virtual machines.

* * * * *